United States Patent [19]
Shen et al.

[11] Patent Number: 5,162,679
[45] Date of Patent: Nov. 10, 1992

[54] SENSE AMPLIFIER WITH DEPLETION TRANSISTOR FEEDBACK

[75] Inventors: Ju Shen, San Jose; Albert L. Chan, Palo Alto; Chan-Chi J. Cheng, San Jose, all of Calif.

[73] Assignee: Lattice Semiconductor Corporation, Hillsboro, Oreg.

[21] Appl. No.: 695,181

[22] Filed: May 3, 1991

[51] Int. Cl.$^5$ ............................................. G01R 19/00
[52] U.S. Cl. .................................................... 307/530
[58] Field of Search ................ 307/530, 443, 465, 289

[56] References Cited

U.S. PATENT DOCUMENTS

| 4,670,675 | 6/1987 | Donoghue | 307/530 |
| 4,758,749 | 7/1988 | Rapp | 307/530 |
| 4,823,031 | 4/1989 | Kadakia | 307/530 |

*Primary Examiner*—Eugene R. LaRoche
*Assistant Examiner*—Evelyn A. Lester

[57] ABSTRACT

A sense amplifier circuit is disclosed which utilizes a field effect transistor having a negative threshold voltage to provide a faster switching speed for a given current consumption. A depletion mode transistor is utilized as the feedback transistor, with the gate of the depletion mode transistor being coupled to the output of the second stage of the sense amplifier. The first stage of the sense amplifier includes in addition to the depletion mode transistor a second field effect transistor connected in series with said feedback transistor, with the gate and drain of the second transistor being commonly connected. The sense amplifier circuit also includes third and fourth stages providing inversion and amplification of the signal provided at the output of the second stage, with the third and fourth stages comprising a depletion load inverter and a CMOS inverter, respectively.

10 Claims, 2 Drawing Sheets

SENSE AMPLIFIER WITH DEPLETION TRANSISTOR FEEDBACK

BACKGROUND OF THE INVENTION

1. Field of the Invention

This invention relates generally to the field of amplifier circuits, and more particularly to sense amplifier circuits which may be used in conjunction with memory arrays to determine whether the cells in the array are either programmed or erased.

2. Description of the Prior Art

Sense amplifiers in general are utilized to convert a relatively small voltage swing to a higher voltage swing to provide a potential suitable for driving other circuits, which may be, for example, logic circuits.

In the prior art, to determine the programmed or erased state of cells in a memory array typically one sense amplifier is utilized for each column of cells in the array. The condition of cells along a column of the array is determined by connecting the input terminal of the sense amplifier to the column (product term line) and applying an appropriate potential to the word line (row line) which corresponds to the row of cells in which the cell to be read is located. More particularly, if the memory array is comprised of rows and columns of transistors, a typical operation for reading a cell would be to apply a high voltage (approximately 5 volts) to word line which includes the cell to be read. If the cell which is being read is not programmed, approximately two volts will appear on the column which is connected to the input terminal of the sense amplifier. This terminal is typically denoted as PT. If the cell at the intersection of the product term line and word line is programmed, then approximately 1.5 volts will be sensed at the input terminal PT of the sense amplifier. This provides a voltage swing of approximately 0.5 volts. In a typical prior art circuit, such as that illustrated in FIG. 1, a one-half volt swing at input terminal PT results in a voltage swing at the output of between zero and five volts. Another prior art sense amplifier circuit similar to sense amplifier circuit 1 of FIG. 1 herein is disclosed in FIG. 5 of U.S. Pat. No. 4,833,646 to John E. Turner issued May 23, 1989 and assigned to the assignee of this application.

It will be appreciated that since one sense amplifier is used for each column of cells in a memory array, as the array becomes more dense, the increasing number of sense amplifiers required to be utilized can present a current drain problem because it takes DC bias current to detect small voltage changes at S.A. input terminal and amplify it to full voltage swing which may require an undesirably high amount of current for the array.

Turning to FIG. 1, prior art sense amplifier circuit 1 is comprised of a number of stages of N-MOS field effect transistor devices. To illustrate the relationship between sense amplifier circuit 1 and its associated memory cells, the programmed/unprogrammed condition of which is to be determined, memory cells M1-M2, wordlines WL1 and WL2, and product term lines, denoted PTL1 and PTL2 are illustrated in FIG. 1. Input terminal PT is connected to PTL1 and by applying a voltage to WL1, the programmed/unprogrammed state of cell M1 can be determined. Similarly, the programmed/unprogrammed state of cell M2 may be determined by applying a voltage to WL2. Sense amplifier circuit 1 includes five stages of amplification between input terminal PT, to which a column PTL1 of the memory array is connected for reading the programmed or erased state of a devices connected to. column PTL1, and the final output terminal indicated SA OUT. As mentioned above, one sense amplifier is required for each column and it will of course be appreciated that FIG. 1 illustrates a single sense amplifier which is connected to PTL1 of an associated memory array. In sense amplifier circuit 1, VCC will typically be plus five volts with respect to the ground terminal (indicated by GND) for sense amplifier circuit 1. The first stage of sense amplifier circuit 1 includes N-channel field effect transistor T1 having its drain connected to VCC and its source connected to input terminal PT. It will be recalled that terminal PT is the input terminal and provides the input voltage swing for sense amplifier 1. Transistor T2, also a N-channel field effect transistor, has its drain connected to input terminal PT, its source connected to ground (GND) and its gate connected to input terminal PT. The second stage in sense amplifier circuit includes N-channel field effect transistor T3 having its gate connected to input terminal PT, its source connected to ground and its drain connected to node N1. The second stage of sense amplifier circuit 1 is completed by N-channel depletion mode transistor T4 having its drain connected to VCC, its source connected to node N1 and its gate connected to the gate of N-channel transistor T1, both of which are connected to node N1. The third stage of sense amplifier circuit 1 includes N-channel field effect transistor T5 with its drain connected to VCC, its source connected to node N2 and its gate connected to node N1. N-channel transistor T6 has its drain connected to node N2, its source connected to ground (GND) and its gate connected in common to the gate of N-channel transistor T3 (which is connected to input terminal PT).

In the fourth stage of sense amplifier circuit 1 N-channel depletion mode field effect transistor T7 has its drain connected to VCC, its source connected to node N3 and its gate also connected to node N3. Series connected in this stage to N-channel depletion mode transistor T7 is N-channel field effect transistor T8 which has its drain connected to node N3, its source connected to ground (GND) and its gate connected to node N2. In the fifth and final stage of sense amplifier circuit 1, N-channel depletion mode transistor T9 has its drain connected to VCC, its source connected to node N4 and its gate also connected to node N4. Series connected to N-channel depletion mode field effect transistor T9 is transistor T10 with its drain connected to node N4, its source connected to ground and its gate connected to node N3. Output terminal SA OUT is connected to node N4 by line 3. It will of course be appreciated that the fourth and fifth stages are depletion load inverter stages which provide both signal inversion and amplification.

Although sense amplifier circuit 1 operates satisfactorily, the amount of current required for the circuit operation is from 800 micro-amps to near one milliamp. As the density of related memory arrays increases, the total current required for the sense amplifiers in the array using a sense amplifier of the type illustrated in FIG. 1 becomes undesirably high. The amount of current drawn by sense amplifier circuit 1 may be reduced by adjusting transistor sizes, however with a reduced current flow the speed is correspondingly reduced. Running sense amplifier circuit 1 in the 300 to 400 microamp per column current draw, the speed of operation of sense amplifier circuit 1 is less than that of sense amplifier circuit in accordance with the present invention, which will be described fully hereinafter.

To better appreciate the advantages of the circuit of the present invention, it is helpful to describe the operation of prior art sense amplifier circuit 1 to illustrate its disadvantage in current consumption. When the potential on input terminal PT is low (approximately 1.5 volts in our example), transistors T3 and T6 will be less conductive than transistors T4 and T5, which will result in node N1 being high, node N2 being high and node N3 being low. With node N3 being low, the conduction of transistor T10 will be weak, resulting in node N4 being high, M1, T1, T7, T8, will consume the majority of the currents.

Conversely, when input potential to input terminal PT is high (approximately 2 volts), transistors T3 and T6 will be highly conductive and transistors T4 and T5 weakly conductive. With respect to the potentials at the various nodes, nodes N1 and N2 will be low, which will make node N3 go high and node N4 go low, T3, T4, T5, T6, T9, T10 will take the majority of currents. The additional number of branches in the prior art circuit contribute to additional current comsumption.

Another disadvantage to sense amplifier circuit 1, with respect to the sense amplifier in accordance with the present invention, is that the switching speed of sense amplifier circuit 1 for a desirable sense amplifier current of about 300-400 microamps is slower than that for the sense amplifier circuit of the present invention.

SUMMARY OF TIME INVENTION

An object of the present invention is to provide a sense amplifier circuit which for a given current consumption provides faster switching time than sense amplifier circuits of the prior art.

Another object of the present invention is to provide a sense amplifier circuit which requires fewer components and yet provides better performance in switching speed for a given current requirement for a sense amplifier in accordance with the prior art.

It is another object of the present invention to provide a sense amplifier circuit which may be biased at a voltage level which provides greater noise immunity than sense amplifier circuits of the prior art. In accordance with the present invention, a sense amplifier circuit is provided which utilizes a feedback transistor having a negative threshold voltage. This feedback transistor is coupled between the input terminal of the sense amplifier circuit and the second stage of the sense amplifier circuit to provide a sense amplifier circuit having a faster switching speed at low current consumption and a reduced susceptibility to noise.

In accordance with the invention, the feedback transistor utilized is a depletion mode transistor.

BRIEF DESCRIPTION OF THE DRAWINGS

Other objects and advantages of the invention will become apparent from a study of the specification and drawings in which.

DETAILED DESCRIPTION OF THE INVENTION

Figure 2:
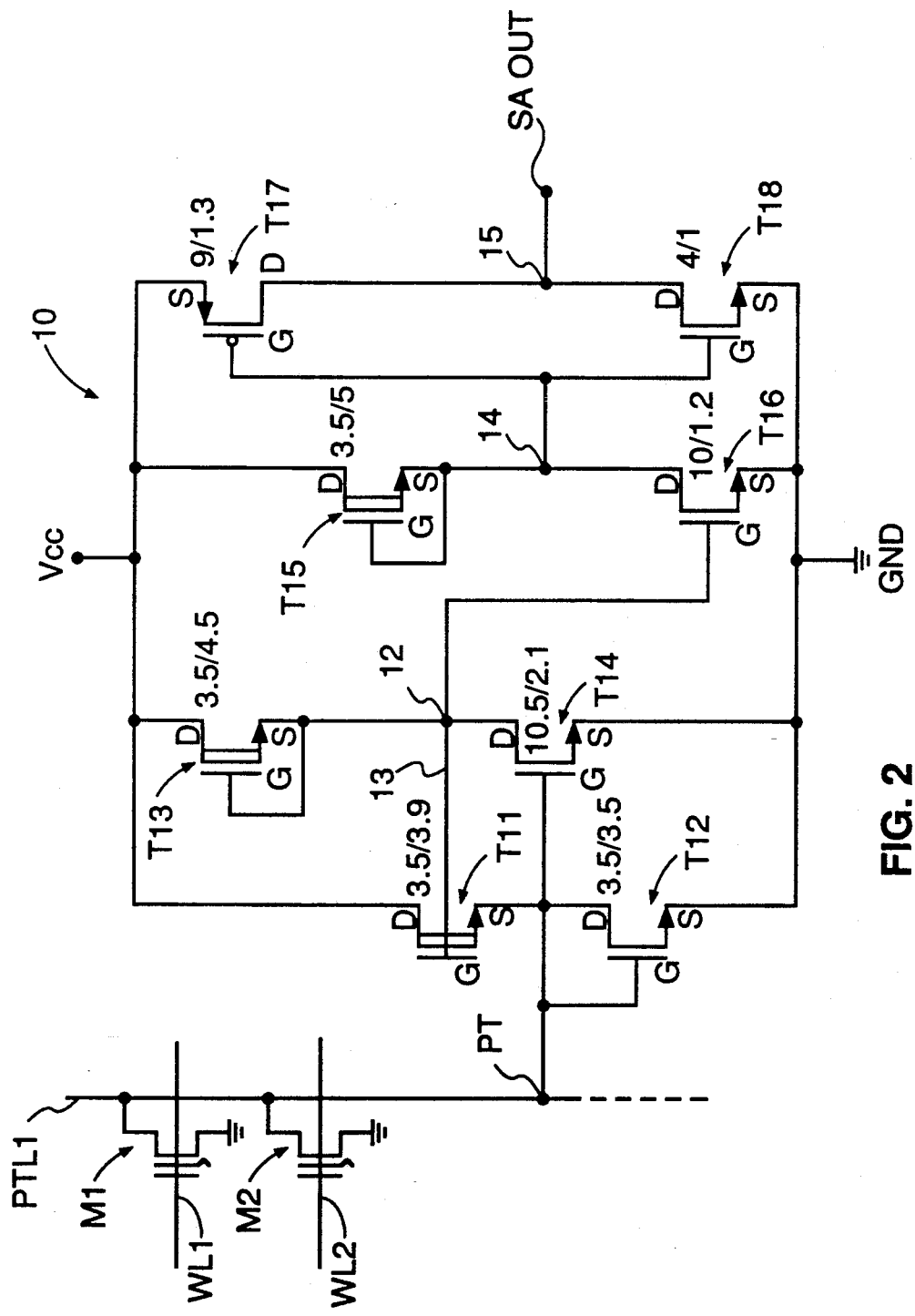
FIG. 2 illustrates the sense amplifier circuit in accordance with the present invention.

Attention is directed to FIG. 2 where sense amplifier circuit 10 in accordance with the present invention is illustrated. Input terminal PT is connected to column PTL1 of a memory array partially illustrated in FIG. 2. It will be appreciated by comparison of sense amplifier circuit 10 of the present invention with sense amplifier circuit 1 of the prior art that the sense amplifier 10 in accordance with the present invention is simplified by, among other things, the reduction of the number of stages required to accommodate the sense amplification. As will be appreciated after a description of the operation of sense amplifier circuit 10, this circuit also provides improved performance over sense amplifier circuit 1 of the prior art at a given current consumption.

Turning to FIG. 2, the stages of sense amplifier circuit 10 are supplied with a positive potential at terminal VCC of preferably approximately positive five volts with respect to ground terminal GND. The first stage of sense amplifier circuit 10 includes N-channel depletion mode feedback transistor T11, the drain of which is connected to VCC, and the source of which is connected to input terminal PT. Also included in the first stage is N-channel transistor T12, the drain of which is connected to input terminal PT, the source of which is connected to ground, and with the gate connected to input terminal PT. The second stage of sense amplifier 10 includes N-channel depletion mode transistor T13 having its drain coupled to VCC, and its gate and source commonly connected. The commonly connected gate and source of transistor T13 is connected to first output terminal 12. Although it is preferable to use a depletion mode transistor to connect VCC to first output terminal 12, a linear impedance, such as a resistor, could be used instead of transistor T13. Feedback from the second stage to the first stage is provided over line 13 which connects first output terminal 12 to the gate of feedback transistor T11. Finally, the second stage of sense amplifier circuit 10 includes N-channel transistor T14, the drain of which is connected to first output terminal 12, the source of which is connected to ground (GND) and the gate of which is connected to input terminal PT.

It will be observed that in FIG. 2 that adjacent to each of the transistors is a pair of numbers separated by a slash. These numbers indicate the relative ratio of the width to length of the channel of the indicated device. The first number of the pair is indicative of the width of the channel and the second number is indicative of the length of the channel. It will be appreciated by those skilled in the art that other ratios may be utilized and that the ratios given are for illustrative purposes and do not limit the invention claimed herein.

The third stage of sense amplifier circuit 10 includes N-channel depletion mode field effect transistor T15 having its drain connected to VCC, and its source connected to second output terminal 14. The gate of transistor T15 is connected to the source of transistor T15. Alternatively, another impedance device could be used to connect second output terminal 14 to VCC, it is preferable that a depletion mode transistor be utilized. Connected between second output terminal 14 and ground is N-channel field effect transistor T16 having its drain connected to second output terminal 14 and its source connected to ground (GND). The gate of transistor T16 is coupled to first output terminal 12. It will be appreciated by those skilled in the art that the third stage is a depletion load inverter amplifier circuit. However, other amplifier circuits may be utilized in practicing the present invention and the specific type of amplifier circuit used at this stage is not important.

The final stage of sense amplifier circuit 10 includes P-channel field effect transistor T17 having its source connected to VCC, its drain connected to third output terminal 15 and its gate connected to second output terminal 14. The final stage further includes N-channel field effect transistor T18 having its drain connected to third output terminal 15, its source connected to GND and its gate connected to second output terminal 14. And it will also be appreciated that the commonly connected drains of transistors T17 and T18 provide the output of sense amplifier circuit 10 at terminal SA Out. It will be appreciated that the final stage of sense amplifier circuit 10 is of the CMOS inverter type, however other variations could be utilized.

Turning to the operation of sense amplifier circuit 10, under the condition that the input signal to terminal PT is low, transistor T14 is weakly conducting which results in first output terminal 12 going high, which causes transistor T11 to strongly conduct. Transistor T12 is weakly conducting because its gate is low, therefore more current from T11 flows to memory cell M1. The resulting output circuit at first output terminal 12 drives the third stage of sense amplifier circuit 10 via the connection to the gate of transistor T16, and the final stage of sense amplifier circuit 10 is driven by the connection of second output terminal 14 to the gates of transistors T17 and T18.

Figure 1:
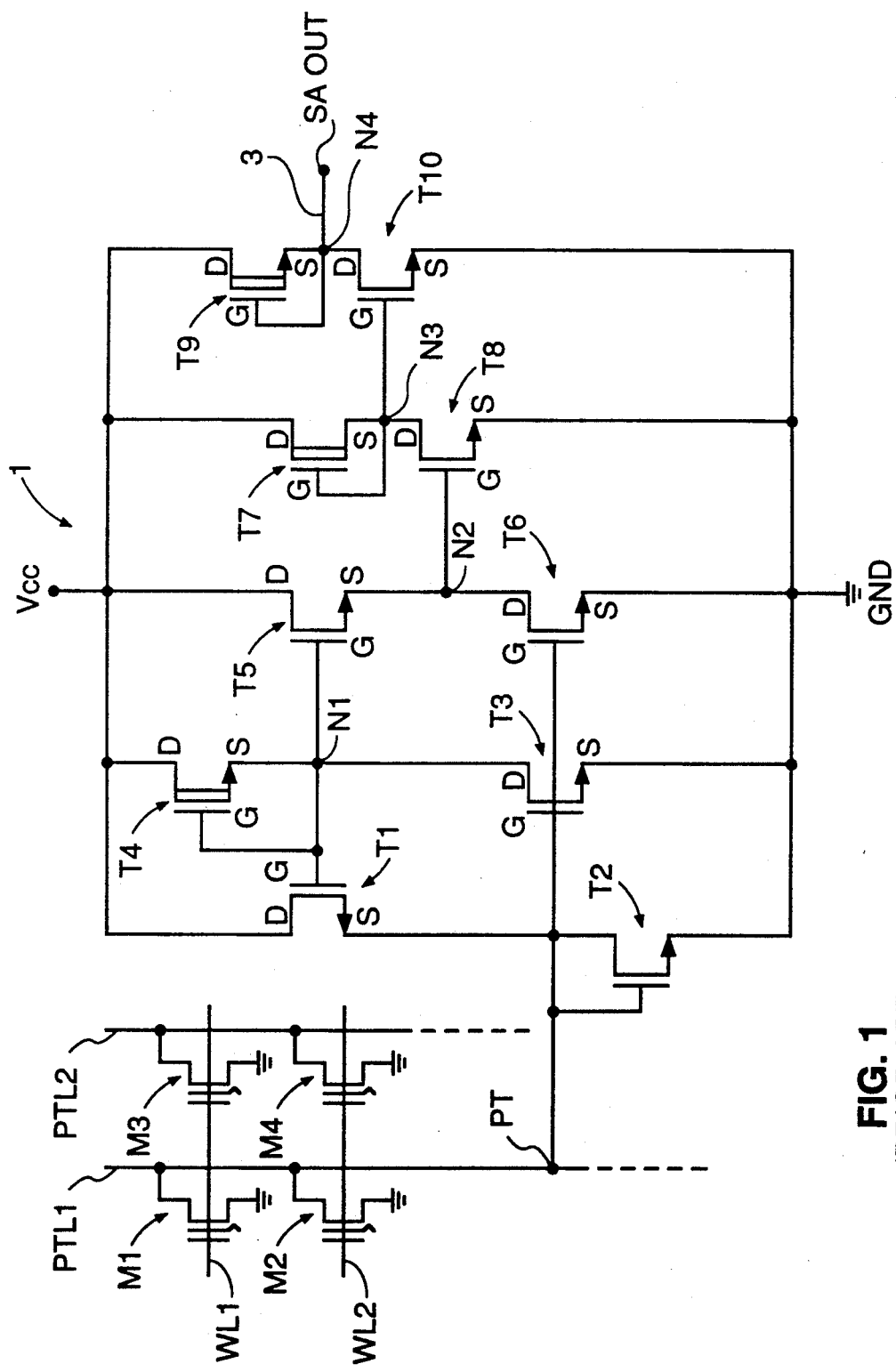
FIG. 1 illustrates a sense amplifier circuit in accordance with the prior art.

When the signal to input terminal PT is high, (approximately 2 volts in our example) transistor T14 is caused to conduct more strongly, which lowers the voltage of first output terminal 12 to the near zero volts, thereby causing feedback transistor T11 to conduct relatively weakly. Compared to the prior art circuit of FIG. 1, there are a fewer number of transistors consuming current.

The utilization of a depletion mode transistor as the feedback transistor in this circuit, makes it easier to make terminal PT stay high and node 12 stay near zero volt at the same time. Under this condition, we have a weak pull up through the depletion mode transistor T11 ready to be pulled down fast in the next transition. While on the other hand, when PT is low, node 12 stays high and this makes the depletion mode transistor T11 pulling up strong, making a fast low to high transition when the row transistors are turned off. It will be appreciated that this is achieved since depletion mode transistor T11 has a threshold voltage of approximately $-3$ volts.

In the prior art sense amplifier circuit 1, transistor T1 serves as the feedback transistor. T1 has approximately 1 volt threshold so N1 is 1 volt higher than PT which makes it unable to drive T8 and it is necessary to have the third stage of T5 and T6 to shift the voltage level of N2 to be suitable for T8 compared with current invention of a depletion transistor with $-3$V VT. Accordingly, it will be appreciated that it is highly advantageous to utilize sense amplifier circuit 10 since the feedback transistor used therein (T11) has a negative threshold voltage and permits a much faster switching for a given current draw between VCC and ground.

The foregoing illustrates one embodiment of the present invention, however various modifications and variations from this embodiment may be made by those skilled in the art without departing from the spirit and scope of the invention. It is of course also understood that the invention is not limited by the foregoing description and is defined by the following claims.

We claim:

1. An amplifier circuit comprising:

an input terminal (PT);

first (VCC) and second (GND) power terminals for the application therebetween of an operating potential;

a first output terminal (12);

a first field effect transistor (T11) of first conductivity type having gate, drain, and source terminals, said first field effect transistor having a negative threshold voltage;

a second field effect ransistor (T12) of first conductivity type having gate, drain, and source terminals;

means coupling said first power terminal to said drain terminal of said first field effect transistor;

means coupling in common said source terminal of said first field effect transistor (T11) to said drain terminal of said second field effect transistor (T12);

means coupling said input terminal (PT) to said gate terminal of said second field effect transistor (T12);

means coupling said input terminal (PT) to said commonly connected source terminal and drain terminal of said first (T11) and second (T12) field effect transistors respectively;

means coupling said source terminal of said second field effect transistor (T12) to said second power terminal (GND);

a third field effect transistor (T14) of first conductivity type having gate, drain and source terminals;

means coupling said source terminal of said third field effect transistor (T14) to said second power terminal (GND);

means coupling said drain terminal of said third field effect transistor (T14) to said first output terminal (12);

first circuit means coupling said first output terminal (12) to said first power terminal;

means coupling said gate terminal of said first field effect transistor (T11) to said first output terminal (12); and means coupling said gate of said third field effect transistor (T14) to said input terminal (PT).

2. The circuit according to claim 1, wherein said first circuit means comprises a fourth field effect transistor (T13) of first conductivity type and having a negative threshold voltage, said fourth field effect transistor having gate, drain and source terminals, and wherein said drain terminal of said fourth field effect transistor is connected to said first power terminal and said gate and source terminals of said fourth field effect transistor are connected to said first output terminal.

3. The circuit according to claim 2, further including:

a second output terminal (14);

a fifth field effect transistor (T16) of first conductivity type having drain, gate, and source terminals;

means coupling said drain terminal of said fifth field effect transistor to said second output terminal;

means coupling said source terminal of said fifth field effect transistor to said second power terminal (GND);

second circuit means coupling said second output terminal to said first power terminal; and field effect transistor (T16) to said first output terminal (12).

4. The circuit according to claim 3, wherein said second circuit means comprises a sixth field effect transistor (T15) of first conductivity type and having a negative threshold voltage, said sixth field effect transistor having gate, drain and source terminals, and wherein said drain terminal of said sixth field effect transistor is connected to said first power terminal (VCC) and said gate and source terminals of said sixth field effect transistor are connected to said second output terminal (14).

5. A circuit according to claim 4, further including:
a third output terminal (15);
a seventh field effect transistor (T17) of second conductivity type having source, gate and drain terminals;
means coupling said source terminal of said seventh field effect transistor (T17) to said first power terminal (VCC);
means coupling said drain terminal of said seventh field effect transistor (T17) to said third output terminal (15);
an eighth field effect transistor (T18) of first conductivity type having drain, gate and source terminals;
means coupling said drain terminal of said eighth field effect transistor (T18) to said third output terminal (15);
means coupling said source terminal of said eighth field effect transistor to said second power terminal (GND);
means coupling said gate terminal of said seventh field effect transistor to said second output terminal (14); and
means coupling said gate terminal of said eighth field effect transistor (T18) to said second output terminal (15).

6. The circuit of claim 1, wherein said first field effect transistor comprises a depletion mode transistor.

7. The circuit of claim 2, wherein said first field effect transistor comprises a depletion mode transistor.

8. The circuit of claim 3, wherein said first field effect transistor comprises a depletion mode transistor.

9. The circuit of claim 4, wherein said first field effect transistor comprises a depletion mode transistor.

10. The circuit of claim 5, wherein said first field effect transistor comprises a depletion mode transistor.

* * * * *